United States Patent
Fichtl et al.

(10) Patent No.: US 6,855,596 B2
(45) Date of Patent: Feb. 15, 2005

(54) METHOD FOR MANUFACTURING A TRENCH CAPACITOR HAVING AN ISOLATION TRENCH

(75) Inventors: Gabriele Fichtl, München (DE); Jana Haensel, Dresden (DE); Thomas Metzdorf, Dresden (DE); Thomas Morgenstern, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/715,019

(22) Filed: Nov. 17, 2003

(65) Prior Publication Data

US 2004/0094777 A1 May 20, 2004

Related U.S. Application Data

(63) Continuation of application No. PCT/EP02/06090, filed on Jun. 3, 2002.

(30) Foreign Application Priority Data

Jun. 6, 2001 (EP) .............................................. 01113838

(51) Int. Cl.[7] ......................................... H01L 21/8242
(52) U.S. Cl. ...................... 438/243; 438/242; 438/386; 438/255; 438/398; 438/665; 438/964; 257/301; 257/305; 257/534; 257/599
(58) Field of Search ................................ 438/242, 243, 438/386, 255, 398, 665, 964; 257/301–305, 534, 599

(56) References Cited

U.S. PATENT DOCUMENTS

| | | | | |
|---|---|---|---|---|
| 4,729,815 A | * | 3/1988 | Leung ........................ | 438/714 |
| 5,423,941 A | * | 6/1995 | Komura et al. ............. | 438/700 |
| 5,719,080 A | | 2/1998 | Kenney | |
| 5,871,659 A | | 2/1999 | Sakano et al. | |
| 5,998,821 A | * | 12/1999 | Hieda et al. ................. | 257/301 |
| 6,221,784 B1 | | 4/2001 | Schmidt et al. | |
| 6,255,193 B1 | * | 7/2001 | Sperlich et al. ............. | 438/430 |
| 6,358,359 B1 | * | 3/2002 | Peinador et al. ....... | 156/345.12 |
| 6,400,458 B1 | * | 6/2002 | Howald ....................... | 356/496 |
| 6,458,671 B1 | * | 10/2002 | Liu et al. ..................... | 438/391 |
| 6,503,813 B1 | * | 1/2003 | Koburger, III .............. | 438/424 |
| 6,583,020 B2 | | 6/2003 | Uhlig et al. | |
| 6,669,855 B2 | * | 12/2003 | Sasaki et al. ................. | 216/22 |

FOREIGN PATENT DOCUMENTS

| | | |
|---|---|---|
| EP | 0 819 786 A2 | 1/1998 |
| JP | 63240027 | 10/1988 |
| JP | 10022271 | 1/1998 |
| WO | 00/54326 | 9/2000 |

OTHER PUBLICATIONS

Author not listed: "Process for Simultaneously Forming Poly/EPI Silicon Filled Deep and Shallow Isolation Trenches Having a CVD Oxide Cap", IBM Technical Disclosure Bulletin, IBM Corp., vol. 33, No. 7, Dec. 1990 pp. 388–392.

* cited by examiner

Primary Examiner—David Nelms
Assistant Examiner—Andy Huynh
(74) Attorney, Agent, or Firm—Laurence A. Greenberg; Werner H. Stemer; Ralph E. Locher

(57) ABSTRACT

A method for manufacturing a trench capacitor includes the step of etching a shallow isolation trench in a two-step process flow. During a first etching step, an etch chemistry based on chlorine or bromine performs a highly selective etch for silicon. During a second step, the etch chemistry is based on $SiF_4$ and $O_2$ which rather equally etches polysilicon and the collar isolation. On top of the wafer, the deposition of silicon oxide on the hard mask predominates and avoids an erosion of the hard mask. On the bottom of the trench the conformal etching of polysilicon and collar isolation predominates. The method provides an economic process flow and is suitable for small feature sizes.

13 Claims, 2 Drawing Sheets

METHOD FOR MANUFACTURING A TRENCH CAPACITOR HAVING AN ISOLATION TRENCH

CROSS-REFERENCE TO RELATED APPLICATION

This application is a continuation of copending International Application No. PCT/EP02/06090, filed Jun. 3, 2002, which designated the United States and was published in English.

BACKGROUND OF THE INVENTION

Field of the Invention

The invention refers to a method for manufacturing a trench capacitor having an isolation trench. The trench capacitor has a collar isolation and is filled and covered with silicon.

Trench capacitors are used to obtain large capacitances, preferably for DRAMs (Dynamic Random Access Memories) in the form of stand-alone devices or of embedded memory. The trench capacitor is formed within a deep trench within the semiconductor substrate which has single crystal structure. One of the electrodes of the trench capacitor is the doped semiconductor substrate, the other electrode or the storage node of the memory cell is disposed within the trench and is separated from the first electrode by a dielectric layer. The storage node and the two electrodes are situated in the lower portion of the trench towards the bulk substrate. The memory cell further comprises an access transistor which is disposed near the surface of the semiconductor substrate. In order to isolate this so-called active area from the trench capacitor, the first electrode of the capacitor within the substrate is confined by a buried doping area in a vertical direction; and seen in a horizontal direction, the inner electrode made of polysilicon of the capacitor is surrounded by a vertical isolation layer, a so-called collar isolation, preferably a collar silicon oxide.

During the manufacturing of a memory device, first the trench capacitor is manufactured, then the active areas are manufactured. In prior art capacitor configurations, two deep trench capacitors are arranged closely together. The active areas of the respective memory cells are situated on the outer area of the double arrangement of the trench capacitors rather than in-between the two trench capacitors. The upper part in-between the trench capacitors, e.g. reaching from the middle of the first trench and passing over one side of the collar isolation of the first trench capacitor over the silicon substrate and over the collar isolation of the opposing side of the second trench capacitor into the middle of the second trench capacitor. This isolation separates the upper part of the two trench capacitors which are situated closely together. The outer parts of the upper section of the collar isolation are modified to obtain a contact from the active area to the inner electrode of the trench capacitor.

The above-mentioned isolation between the two opposing sides of the trench capacitors is achieved by a shallow trench that covers the upper ends of the two capacitors in the area reaching from between approximately the middle of the inner electrode of the first capacitor to the middle of the inner electrode of the second capacitor. For etching the combination of polysilicon and collar isolation, preferably collar oxide and single crystal silicon, it has to be considered that the material to be etched is a combination of silicon material and isolation material which appear on the horizontal surface to be etched. The etching process must take into account the different properties of the collar isolation and the silicon that are exposed to the etching gases simultaneously. Due to the different etch selectivities of the etching gases within the reactor, it is a challenge to obtain a smooth and flat surface on the bottom of the shallow isolation trench especially as the hard mask that patterns the surface of the semiconductor wafer is typically an oxide or a BSG (Boron Silicate Glass). It is therefore difficult to etch the collar oxide without eroding the hard mask on top of the wafer.

In a conventional etch process flow for etching the shallow isolation trench into the top part of a trench capacitor with collar isolation there is selectivity during the step of etching of silicon so that the collar oxide is less etched than the silicon. As a result, the collar oxide is still present and is projecting out of the bottom of the already etched shallow trench. Then, the collar oxide has to be removed by an additional process step. As a preceding step, the hard mask must be opened.

SUMMARY OF THE INVENTION

It is accordingly an object of the invention to provide a method of fabricating trench capacitor having a shallow trench isolation in its top part with the trench capacitor having a collar isolation which overcomes the above-mentioned disadvantages of the heretofore-known devices and methods of this general type and which method requires only few etch steps to obtain the isolation trench whereby the bottom surface of the trench is substantially flat and even.

With the foregoing and other objects in view there is provided, in accordance with the invention, a method for manufacturing a trench capacitor having an isolation trench, which comprises:

forming a trench capacitor in a trench of a semiconductor substrate, the trench capacitor having:
a lower part formed with an outer electrode, an inner electrode, and a dielectric between said inner and outer electrodes;
an upper part formed with a collar isolation on sidewalls of the trench;
wherein a silicon layer covers the trench capacitor on top of the collar isolation and a hard mask covers the silicon layer.

The method further comprises the steps of:
opening the hard mask to reach a surface of the silicon layer;
in a first etching step, dry etching with an etching gas comprising chlorine or bromine until the collar isolation is reached; and
in a second etching step, dry etching with an etching gas comprising silicon fluoride and oxygen.

In other words, the objects of the invention are achieved by manufacturing a trench capacitor within a semiconductor substrate, the trench capacitor comprising a lower part having a first outer electrode and a second inner electrode and a dielectric arranged between the first and the seconds electrodes; an upper part having a collar isolation on the sidewalls of the trench. A silicon layer covers the trench capacitor on top of the collar isolation and a hard mask covers the silicon layer.

The novel method opens the hard mask so that a surface of the silicon layer is reached, which is followed with a two-step etch. In a first step, dry etching with an etch gas comprising chlorine or bromine until the collar isolation is reached; in a second step, subsequently performing dry etching with an etching gas comprising silicon fluoride.

The method according to the invention requires only two etching steps with different etch chemistry. In addition, the hard mask has to be opened by a conventional etch step in advance. The etching gases for the first step comprise chlorine or bromine. The etch chemistry is maintained up to a depth when the collar isolation is reached. Then the etch chemistry is changed to silicon fluoride ($SiF_4$)based chemistry in order to finalize the etching up to the desired depth. Chlorine chemistry is known to etch silicon or polysilicon selectively to oxide or BSG. As a result, the hard mask being made of oxide or BSG is not eroded and the etching of the silicon and polysilicon on top of the trench capacitor advances fast. In the second etch step, $SiF_4$ is known to etch silicon and isolation material like silicon oxide and silicon nitride with almost no selectivity to each other. But the use of $SiF_4$ in combination with oxygen ($O_2$) has the advantage that by-products, e.g. silicon oxide, are formed that deposit onto the hard mask on top of the wafer. As a result, the bottom of the trench is etched conformly, thereby obtaining a plain and flat bottom of the trench. Although the silicon fluoride based etch chemistry is almost equally etching silicon and oxides, isolation material, or BSG, the deposition on the top surface of the wafer onto the hard mask maintains the hard mask. Moreover, there is an equilibrium of etching and deposition on the top surface of the hard mask so that the mask is substantially maintained and is not deteriorated by erosion. In contrast, within the trench, especially on the bottom surface of the trench, the silicon oxide by-products are not present due to the low amount of oxide in the bottom of the trench so that there is substantially no deposition on the bottom of the trench. In the bottom of the trench, the etching of silicon, polysilicon, and silicon oxide that forms the collar isolation proceeds at substantially the same etch rate.

The etching gases for the first step, i.e. chlorine or bromine-based, can be hydrogen chlorine (HCl) or chlorine ($Cl_2$) and may be diluted by helium (He) or oxygen ($O_2$). The etch gases during the second etch step comprise $SiF_4$ as already disclosed and may additionally contain $CF_4$ (carbon tetrafluoride). The etch gases in the second step may further be diluted with oxygen ($O_2$) and/or argon (Ar).

In order to switch from the first etch chemistry to the second etch chemistry, a measurement is performed that detects the etching of the collar isolation or collar oxide through the detection of the generated by-products. The measurement technique may be optical emission spectroscopy. Alternatively, interferometry can also be used. As a further alternative, the transition from the first etch chemistry to the second etch chemistry can be determined by a time measurement. The optimal time period which is necessary to reach the upper part of the collar isolation can be determined by experiments in advance. This time is pre-set for the production run and the switch from the first to the second etch chemistry is made when the pre-set time has lapsed.

The collar isolation may be made of a collar oxide, preferably a silicon oxide. The hard mask is made of BSG or is made of an oxide, preferably silicon oxide.

The shallow isolation trench is used to isolate the top part of two deep trench capacitors from one another which are located closely side by side to one another. The opposing parts of the collar isolation are removed whereas the not opposing outer parts of the collar oxide are maintained. The isolation trench seen from the top starts within the inner polysilicon electrode of the trench capacitor and extends over the collar oxide of this capacitor, over the silicon between the two capacitors of the semiconductor substrate, over the collar oxide of the neighboring adjacent trench capacitor ending within the polysilicon of its inner electrode.

Other features which are considered as characteristic for the invention are set forth in the appended claims.

Although the invention is illustrated and described herein as embodied in a method for manufacturing a trench capacitor having an isolation trench, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
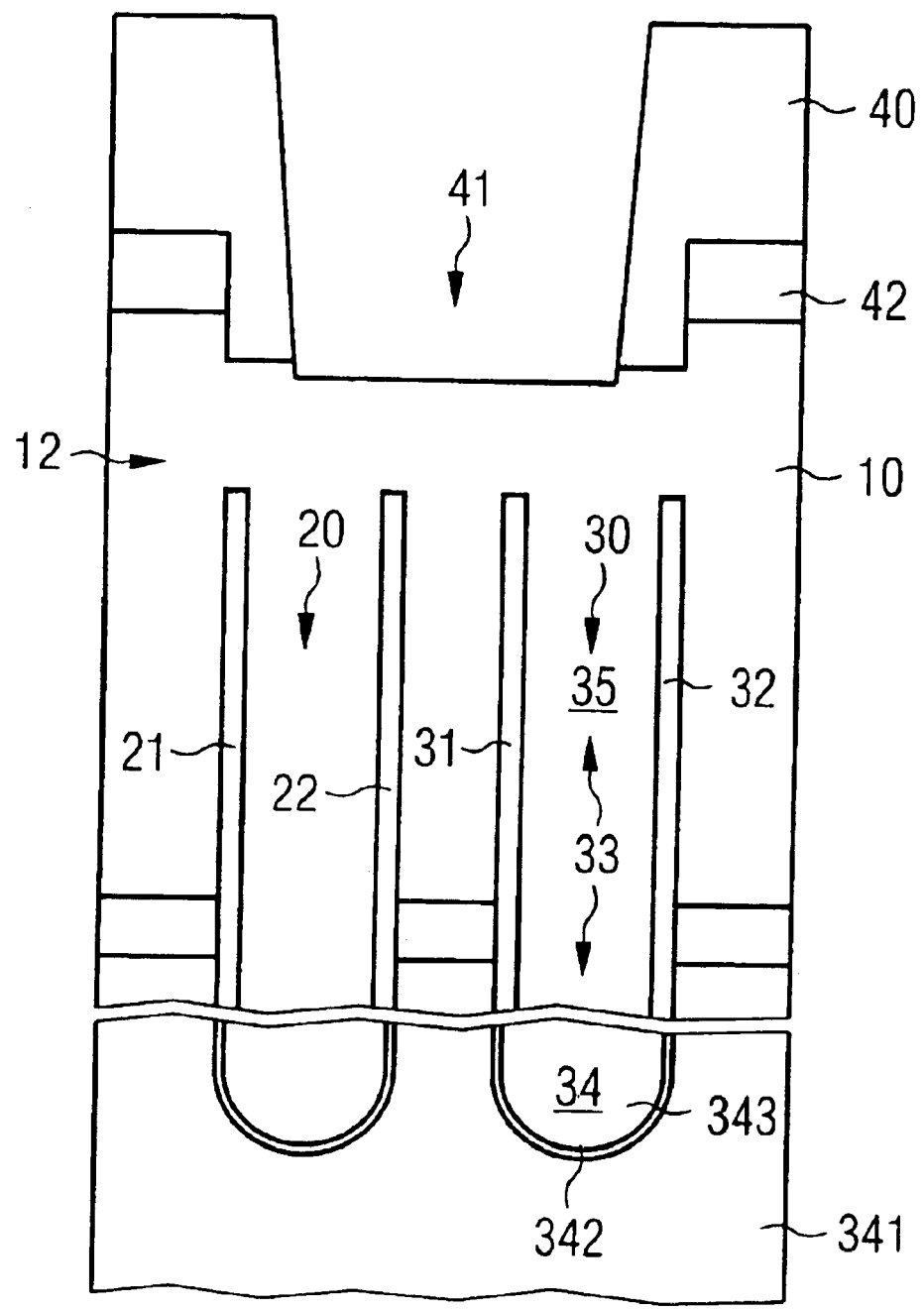
FIG. 1 is a cross-section through a semiconductor wafer with two neighboring trench capacitors with the hard mask already opened.

Referring now to the figures of the drawing in detail and first, particularly, to FIG. 1 thereof, there is shown a silicon substrate 10 with two capacitors 20, 30 almost completed at this manufacturing stage. The capacitors are deep trench capacitors. Several millions of these capacitors are arranged regularly on a DRAM device. The capacitors 20, 30 are grouped together. The capacitor 30 is explained in detail, the capacitor 20 has a corresponding structure. The capacitor 30 has a lower part 34 and an upper part 35. The lower part 34 forms the storage node that stores an electric charge. The lower part 34 comprises a first electrode 341 within the substrate, a dielectric layer 342 arranged on the walls of the trench and an inner electrode 343 filling the lower part 34 of the trench. The dielectric material 342 is silicon nitride. The upper part 35 of the trench capacitor 30 has a collar oxide 31, 32 that isolates the inner electrode 33 from the substrate 10. Close to the right end of the capacitor 30, the access transistor for the memory cell will be formed later on.

The described structure is mirrored to the other capacitor 20. Both capacitors 20, 30 are arranged closely together with no active areas in-between, but to the left side of capacitor 20 and the right side of capacitor 30. In order to isolate the two capacitors from each other, a shallow isolation trench 50 must be formed into the substrate and into the capacitors 20, 30 by a dry etching process. The etching process has to etch the inner electrode of the capacitor, the collar oxide and the single crystal silicon of the bulk silicon between the capacitors at the same time.

The wafer is already covered with an epitaxial layer of silicon. The inner electrodes 23, 33 of the trench capacitors are filled with polysilicon. The semiconductor substrate 10 is also made of silicon. The cross-section depicted in FIG. 1 shows a PAD-nitride 42 and a hard mask 40 on top of the epitaxial silicon layer. The hard mask 40 is made of BSG (Boron Silicate Glass) or may be a silicon oxide. The hard mask 40 has already been patterned during a preceding hard mask open etch step. The opening 41 into the hard mask layer 40 provides a mask for the subsequent etching process steps. The hard mask opening is performed by conventional methods. The process of the invention starts after the hard mask was already opened when the surface 43 of the epitaxial silicon layer is already free.

Figure 2:
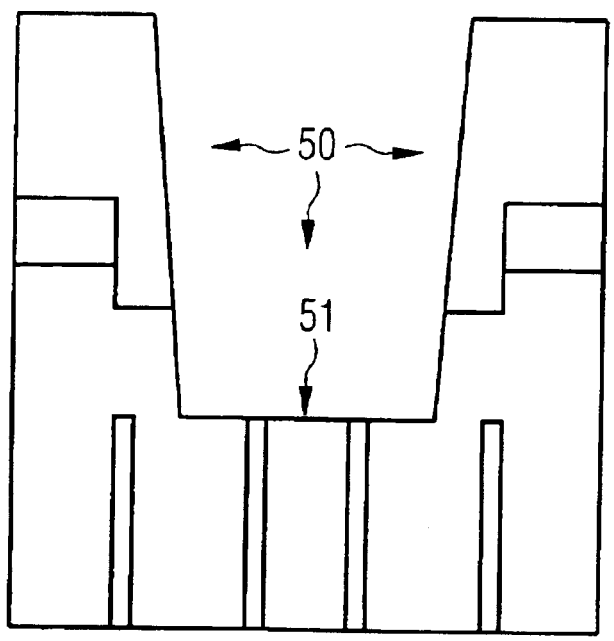
FIG. 2 is a similar diagrammatic section after the first etching step.
Figure 3:
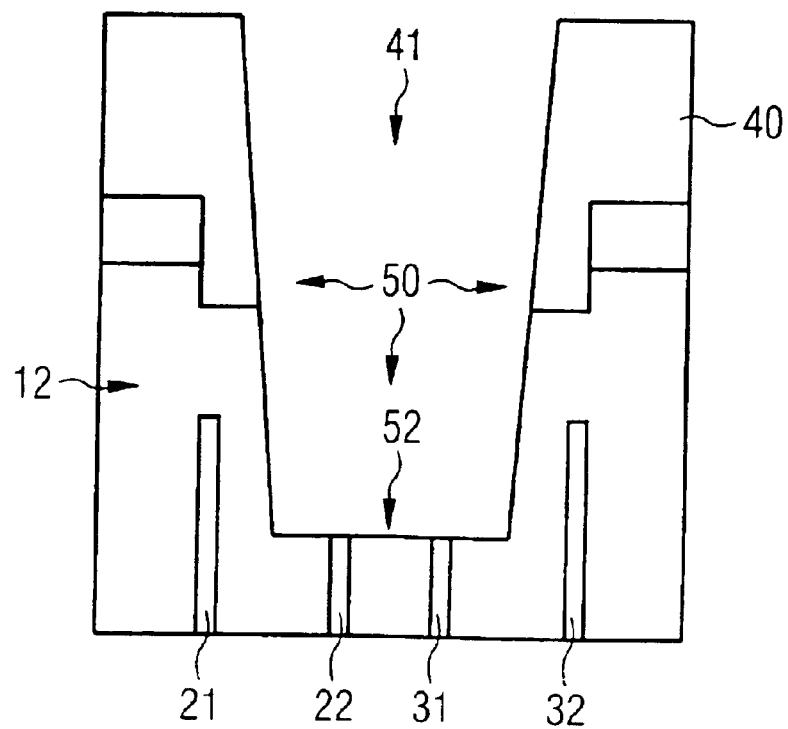
FIG. 3 shows the same cross-section after the completion of the etching process.

In a first etching step, the end of which is shown in FIG. 2, the polysilicon and silicon material 12 within the mask open section 41 is removed by dry etching. The etch step is performed in a dry etching tool, for example a DPS-chamber from Applied Materials Inc. The etch chemistry within the reactor is selected to be highly selective with respect to silicon in order to remove the silicon layer 12 within the open portion 41 of the hard mask. The etch chemistry for the first step is based on chlorine or, alternatively, on bromine. The etch chemistry can include HCl and $Cl_2$ or, alternatively, HBr. The etch chemistry can be diluted with He or $O_2$, or with a combination of He and $O_2$. These etch gases provide for a high-selective silicon etch so that silicon 12 is easily etched whereas the hard mask 40, being made of oxide or BSG, is maintained and is not subject to any erosion.

The first etch step uses etch chemistry that is highly selective to oxide, so that silicon is etched. The first etch step is performed until the top part of the collar oxides 22, 31 of the adjacent trenches 20, 30 is reached, as is shown in FIG. 2. This point of the etch process can be detected by a measurement employing interferometry or optical emission spectroscopy. Alternatively, the state shown in FIG. 2 can be determined by a monitoring of the etching time. In previous experiments a pre-determined time can be defined that is sufficient for the etching process to reach the top part of the collar isolations. The status of the etching process shown in FIG. 2 can be reached after etching the wafer for a time period equal to the pre-determined etching time.

After reaching the oxide material of the collar isolation 22, 31, the etch chemistry has to be changed so that the silicon, also including the collar isolation, are etched. By reaching the status shown in FIG. 2, the etch chemistry within the chamber is changed to a $SiF_4$ base also containing $O_2$. $SiF_4/O_2$ is known to etch oxide and silicon at substantially the same rate. The etch chemistry during the second etch step now starting may further contain $CF_4$. The etch chemistry may be diluted with Ar. The $SiF_4$ based etch chemistry is known to generate $SiO_2$ by-products when etching oxide or BSG. The silicon oxide by-products deposit mainly on the hard mask since the concentration of the by-products is rather high. Since the silicon material dominates at the bottom 52 of the trench, there is no substantial silicon dioxide by-product in this area. Therefore, the etch process continues to etch deeper into the semiconductor wafer since substantially no deposition of silicon oxide takes place on the bottom 52 of the isolation trench. In contrast, an equilibrium of deposition and etching is established in the area of the BSG or silicon oxide hard mask. As a result, the etch process advances within the trench without substantially eroding the hard mask.

The process flow according to the invention results in a substantially flat and even bottom surface 52 of the isolation trench with a two-step process only. There is no need to change the process chamber only the etch chemistry has to be changed from chlorine or bromine-based etch chemistry during the first step to $SiF_4/O_2$-based chemistry during the second step after reaching the collar isolation. The process flow according to the invention is preferably valuable for smaller feature sizes in highly integrated DRAMs. The trend is to have an isolation trench of smaller width and larger depth, so that the aspect ratio of the trench increases. The process according to the invention is of particular value for feature sizes of 0.14 μm (micrometer) and below.

After the end of the shallow isolation trench etch the trench is filled with isolation material, e.g. silicon oxide. Further, the so-called active areas including the access transistor of the memory cell, the connection of the access transistor to the inner polysilicon electrode of the trench, and finally, word and bit lines are formed.

The isolation trench only covers the mutually opposite, neighboring collar isolations 22, 31 of the two trench capacitors 20, 30. The non-opposing collar oxides 21, 32 are left unchanged. The sidewall of the trench ends within the polysilicon material of the inner electrode of the trench, approximately in the middle of the trench electrode. Thereby, both trench capacitors and memory cells are isolated from each other.

The new process flow reduces the number of steps to two due to a combined deposition/etch step within an ICP (Inductive Coupled Plasma) type etch chamber. Compared to other methods, there is no separate step required to remove the collar isolation. As an advantage of the invention, the top side polysilicon material is etched with a highly selective polysilicon etch chemistry and the collar isolation as well as the polysilicon are etched later with a surface-protecting chemistry that establishes an equilibrium of erosion/deposition on the hard mask rather than an etch only behavior within the isolation trench. The deposition behavior during the second etch step predominates on the top, whereas the bottom of the trench is predominantly etched.

The process parameters in the etch chamber, for example a DPS etch chamber from Applied Materials Inc., during the first and the second etch steps are as indicated in the table below. The parameters include the power for the upper inductive coil of the etch chamber and the power for the lower inductive means which performs a bias power applied to the wafer chuck. The parameters further comprise approximate values for flow rates in units of sccm for the etch gases to be introduced into the chamber.

|  | Source power | Bias power | Pressure | $Cl_2$ | HCl | $He/O_2$ | $CF_4$ | $O_2$ | $SiF_4$ | Ar |
|---|---|---|---|---|---|---|---|---|---|---|
| Unit | W | W | mTorr | sccm | | | | | | |
| 1st step | 550 | 350 | 4 | 30 | 120 | 15 | — | — | — | — |
| 2nd step | 2,500 | 200 | 6 | — | — | — | 61 | 45 | 45 | 150 |

The numbers given above may vary by a range of ±10% and apply to etch tools having reaction chambers for wafers of a size of 300 mm.

We claim:

1. A method for manufacturing a trench capacitor having an isolation trench, which comprises:

forming a trench capacitor in a trench of a semiconductor substrate, the trench capacitor having:
  a lower part formed with an outer electrode, an inner electrode, and a dielectric between the inner and outer electrodes;
  an upper part formed with a collar isolation on sidewalls of the trench;
wherein a silicon layer covers the trench capacitor on top of the collar isolation and a hard mask covers the silicon layer;
opening the hard mask to reach a surface of the silicon layer;
in a first etching step, dry etching with an etching gas comprising chlorine or bromine until the collar isolation is reached; and
in a second etching step, dry etching the semiconductor substrate, the collar isolation and inner electrodes of the trench capacitor with an etching gas including silicon fluoride and oxygen.

2. The method according to claim 1, wherein the etching gas in the first step comprises hydrogen chlorine gas and at least one of the gases helium and oxygen.

3. The method according to claim 1, wherein the etching gas in the first step comprises hydrogen bromine gas and at least one of the gases helium and oxygen.

4. The method according to claim 1, wherein the etching gas in the second step further comprises argon gas.

5. The method according to claim 4, wherein the etching gas during the second step further comprises $CF_4$.

6. The method according to claim 1, which comprises terminating the first etching step and starting the second etching step when, during the first step, a by-product generated from the oxide isolation is detected.

7. The method according to claim 1, which comprises terminating the first etching step and starting the second etching step in response to a signal obtained from a measurement employing interferometry.

8. The method according to claim 1, which comprises terminating the first etching step and starting the second etching step in response to a signal obtained from a measurement employing optical emission spectroscopy.

9. The method according to claim 1, which comprises starting the second etching step after performing the first step during a predetermined time period.

10. The method according to claim 1, wherein the hard mask comprises boron silicate glass.

11. The method according to claim 1, wherein the hard mask comprises silicon oxide.

12. The method according to claim 1, wherein the collar isolation comprises silicon oxide.

13. The method according to claim 1, which comprises forming in the semiconductor substrate at least two closely adjacent trench capacitors having a collar isolation and forming the hard mask relative to the at least two trench capacitors so that portions of the collar isolations facing each other are etched during the second etching step and in that portions of the collar isolations that are not facing each other are maintained during the second etching step.

* * * * *